(12) United States Patent
Matsubara et al.

(10) Patent No.: US 6,861,759 B2
(45) Date of Patent: Mar. 1, 2005

(54) SEMICONDUCTOR APPARATUS OF WHICH RELIABILITY OF INTERCONNECTIONS IS IMPROVED AND MANUFACTURING METHOD OF THE SAME

(75) Inventors: Yoshihisa Matsubara, Kanagawa (JP); Masahiro Komuro, Kanagawa (JP); Manabu Iguchi, Kanagawa (JP); Takahiro Onodera, Kanagawa (JP); Norio Okada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/608,647

(22) Filed: Jun. 27, 2003

(65) Prior Publication Data

US 2004/0000719 A1 Jan. 1, 2004

(30) Foreign Application Priority Data

Jun. 28, 2002 (JP) ........................................ 2002-188927

(51) Int. Cl.$^7$ ............................................... H01L 29/40
(52) U.S. Cl. ........................ 257/774; 257/771; 257/762
(58) Field of Search .................................. 257/774, 750, 257/765, 771, 762

(56) References Cited

U.S. PATENT DOCUMENTS 6,720,654 B2 * 4/2004 Stumborg et al. ........... 257/751

FOREIGN PATENT DOCUMENTS

| JP | 6-97164 | 4/1994 |
| JP | 6-177128 | 6/1994 |
| JP | 11-102909 | 4/1999 |
| JP | 2000-77413 | 3/2000 |
| JP | 2002-75995 | 3/2002 |

* cited by examiner

Primary Examiner—Roy Potter
(74) Attorney, Agent, or Firm—Scully, Scott, Murphy & Presser

(57) ABSTRACT

A semiconductor apparatus includes an under layer, a first insulating layer and a first conductive portion. The under layer is formed above a substrate. The first insulating layer is formed on the under layer. The first conductive portion is formed in a first concave portion which passes through the first insulating layer to the under layer. The first conductive portion includes a first barrier metal layer and a first metal portion. The first barrier metal layer is formed on a side wall and a bottom surface of the first concave portion. The first metal portion is formed on the first barrier metal layer such that the rest of the first concave portion is filled with the first metal portion. The first metal portion includes a first alloy including copper and aluminium.

8 Claims, 19 Drawing Sheets

Fig. 18

| SAMPLE NO. | 1 | 2 | 3 | 4 | 5 | 6 | 7 | 8 |
|---|---|---|---|---|---|---|---|---|
| Al FILM THICKNESS (Å) | 600 | 800 | 800 | 800 | 800 | 1000 | 1000 | REFERENCE |
| HEAT TREATMENT CONDITION | 350°C-1h | 350°C-1h | 300°C-1h | 335°C-1h | 350°C-30m | 300°C-1h | 335°C-1h | |
| SHEET RESISTANCE (mΩ/□) | 53.4 | 68.0 | 48.2 | 58.8 | 60.4 | 49.8 | 44.5 | 45.6 |
| ALLOY FILM THICKNESS (Å) | 4555 | 4341 | 4639 | 4348 | 4517 | 4936 | 4454 | 3700 |
| RESISTIVITY (Ωcm) | 2.43E-06 | 2.95E-06 | 2.23E-06 | 2.55E-06 | 2.73E-06 | 2.46E-06 | 3.21E-06 | 1.69E-06 |
| SHEET RESISTIVITY CONVERTED INTO 3200 Å | 75.9 | 92.3 | 69.8 | 79.9 | 85.3 | 76.8 | 100.2 | 52.7 |

SEMICONDUCTOR APPARATUS OF WHICH RELIABILITY OF INTERCONNECTIONS IS IMPROVED AND MANUFACTURING METHOD OF THE SAME

BACKGROUND OF THE INVENTION

1. Field of the Invention

The present invention relates to a semiconductor apparatus and a manufacturing method of the same, more particularly, the semiconductor apparatus of which reliability of interconnections is improved and the manufacturing method of the same, the interconnections are formed by using the damascene process.

2. Description of the Related Art

In recent years, the miniaturization of the interconnections and the multi-level interconnection are being carried according to the high integration of the semiconductor apparatus and the miniaturization of the semiconductor chip. The process, which is so-called damascene method (process), is generally used for forming the multi-level interconnection structure. This damascene method, which forms interconnections and vias, includes three steps. The first step is to form a via hole or a trench in an insulation film. The second step is to form a conductive film on the surface of the insulation film, in and above the via hole or the trench. The third step is to polish the conductive film on the surface of the insulation film and above the via hole or the trench by the chemical mechanical polish method (CMP: Chemical Mechanical Polishing). This method is suitable for forming the multi-level interconnection made from conductive materials which includes copper, even though copper is difficult to etching.

The conventional damascene process will be described with reference to drawings. FIGS. 1A to AC are sectional views showing the part of the conventional damascene process.

Firstly, as shown in FIG. 1A, a first etch stopping film 102 such as SiN and a first inter-level dielectric 103 such as SiO2 are formed by this order on a substrate 101 on which MOS transistors and the like are formed. Next, a resist pattern is formed on the first inter-level dielectric 103 as a mask for a conventional dry etching method. Then, a first trench 103a is formed by etching the first inter-level dielectric 103 and the first etch stopping film 2 by using the conventional dry etching method. Next, a first barrier metal film 104 of TiN is formed on the first inter-level dielectric 103 and in the first trench 103a.

In this situation shown in FIG. 1A, a seed metal (not shown) of Cu is formed on the first barrier metal film 104 by the sputtering method. The first barrier metal film 4 prevents the diffusion of the interconnection material. The seed metal facilitates the plating growth of Cu which is used for the interconnection. Then, a Cu 105 is formed by the electrolysis plating method on the seed metal. This situation is show in FIG. 1B.

In this situation, the Cu 105 and the barrier metal film 104 on the first inter-level dielectric 103 are removed by the CMP method. As a result, a first Cu interconnection 105a is formed in the first trench 103a. This situation is show in FIG. 1C.

After that, by repeating processes similar to the above-mentioned, a semiconductor apparatus with the desirable multi-level interconnections is obtained.

The multi-level interconnection of Cu can be formed by the above-mentioned damascene method. However, in this method, the adhesiveness between Cu, which is the interconnection material, and TiN, which is the barrier metal, is not always good enough. Therefore, the degradation problem arises in the electromigration tolerance.

The technique of a semiconductor apparatus and a manufacturing method of the same related to this problem is disclosed in Japanese Laid Open Patent Application (JP-A, 2000-77413). In this patent application, the structure to make barrier metal composed of Al intervene between Cu and TiN is disclosed to solve the problem.

Hereinafter, the technique of the above-mentioned conventional patent application (hereinafter referred to as "the patent application" is concretely explained. FIGS. 2A to 2C are sectional views showing the part of the conventional damascene process. As shown in FIG. 2A, first, an under layer barrier metal film 118a composed of TiN is formed on a first inter-level dielectric 103 and in a first trench 103a which was formed in the first inter-level dielectric 103. Next, an upper layer barrier metal film 118b composed of Al is formed on the under layer barrier metal film 118a. After that, a Cu 105 is formed on the upper layer barrier metal film 118b by the plating method as shown in FIG. 2B. Then, a first Cu interconnection 105a is formed by polishing the under layer barrier metal film 118a, the upper layer barrier metal film 118b and the Cu 105 on the first inter-level dielectric 103 by the CMP method as shown in FIG. 2C. By forming barrier metals having the layered structure, the adhesiveness between Cu and barrier metal can be improved. Then, by restraining the movement of Cu atoms, the Cu interconnection which has high electromigration tolerance can be formed.

However, as the progress of the miniaturization of the interconnections, there is a problem that it becomes difficult for Cu to be buried in the dielectric by the method of the patent application mentioned above.

Generally, when the trench width and the via hole diameter are being small and the aspect ratio (the trench depth/the trench width or the via hole depth/the via hole diameter) is being big, it becomes difficult for Cu to be buried.

In case of the patent application mentioned, after forming the trench and the via hole, the upper layer barrier metal film 118b composed of Al is formed in addition to the under layer barrier metal film 118a composed of TiN in the method. Therefore, the margin of Cu being buried becomes small because of the width of the upper layer barrier metal film 118b. As a result, as shown in FIG. 3A, a void defect 119 is formed in the trench or the via hole in the Cu 105 at the step of Cu being buried. Or, the trench and the via hole have been filled with Al when a film thickness of the upper layer barrier metal film 118b becomes equal to or more than ½ of the width of the trench and the diameter of the via hole. Moreover, there is a problem that the equipment, which has an enough property of Cu being buried, becomes necessary to form the upper layer barrier metal film 118b uniformly in the minute trench and the minute via hole.

Also, as the progress of the miniaturization of the interconnections, another problem arises in the reliability of the interconnection in addition to the problem of the degradation of the property of interconnection being buried. That is, the reliability of the interconnection is decreased because the void defect is generated after the interconnections forming.

Generally, the grain size of Cu depends on the width of the interconnection and the diameter of the via. In the interconnection with the wide width, the grain size tends to be big. On the other hand, in the interconnection with the fine width and in the via with fine diameter, the grain size tends to be small. The difference with grain size is equivalent to the difference with entropy. Then, when the heat-treatment is done to the interconnection and the via each of which has different grain size, material moves to balance entropy. Therefore, the transportation phenomenon occurs, which Cu in the fine interconnection and the fine via is sucked by the wide interconnection with low entropy.

This transportation phenomenon is explained with reference to FIG. 3B. As for the grain size in the via, the entropy is big because the grain size is small. On the other hand, as for the grain size in the interconnection, the entropy is small because the grain size is big. As a result, Cu atoms in the via has moved to the interconnection to balance entropy when the heat-treatment is done after the interconnection forming. So, the void defect 119 occurs in the via and the connection reliability of the interconnection has decreased.

In the damascene method which forms Cu interconnection using the CMP method, when the interconnection forming, it is important to restrain the occurrence of the void defect which accompanies the degradation of the property of the interconnection being buried in the trench. In the method of the patent application above-mentioned, these problems can not be solved.

SUMMARY OF THE INVENTION

Therefore, an object of the present invention is to provide a semiconductor apparatus to restrain occurrence such as the void defects which are caused by the transportation phenomenon of Cu atoms and a manufacturing method of the same that is possible to restrain occurring the degradation of the property of the interconnection being buried in the trench or the via.

Another object of the present invention is to provide a semiconductor apparatus having interconnections of which reliability is improved and a manufacturing method of the same.

In order to achieve an aspect of the present invention, the present invention provides a semiconductor apparatus including: an under layer, a first insulating layer and a first conductive portion. The under layer is formed above a substrate. The first insulating layer is formed on the under layer. The first conductive portion is formed in a first concave portion which passes through the first insulating layer to the under layer. The first conductive portion includes a first barrier metal layer and a first metal portion. The first barrier metal layer is formed on a sidewall and a bottom surface of the first concave portion. The first metal portion is formed on the first barrier metal layer such that the rest of the first concave portion is filled with the first metal portion. The first metal portion includes a first alloy including copper and aluminium.

In the semiconductor apparatus of the present invention, a containing percentage of alumimium in the first alloy is 0.1 to 10 atm %.

The semiconductor apparatus of the present invention, further includes a second insulating layer and a second conductive portion. The second insulating layer is formed on the first insulating layer and the first conductive portion. The second conductive portion is formed in a second concave portion which passes through the second insulating layer to the first conductive portion. The second conductive portion includes a second barrier metal layer and a second metal portion. The second barrier metal layer is formed on a side wall and a bottom surface of the second concave portion. The second metal portion is formed on the second barrier metal layer such that the rest of the second concave portion is filled with the second metal portion. The second metal portion includes a second alloy including copper and aluminium. The first conductive portion is one of an interconnection and a via. The second conductive portion is one of an interconnection and a via. The containing percentage of alumimium in the second alloy is 0.1 to 10 atm %.

In the semiconductor apparatus of the present invention, a ratio of an area of larger one of the first conductive portion and the second conductive portion to an area of the other is equal to or greater than 20.

In the semiconductor apparatus of the present invention, a resistance of the first conductive portion is lower than that of the first conductive portion when the first metal portion consists of alumimium.

In the semiconductor apparatus of the present invention, an aspect ratio of the first concave portion is equal to or greater than 2.

In the semiconductor apparatus of the present invention, a width of the first conductive portion is equal to or less than 0.18 μm. A depth of the first conductive portion is equal to or greater than 0.3 μm. A thickness of the first barrier metal layer is equal to or greater than 0.01 μm, such that the first metal portion is formed in the first concave portion.

In order to achieve another aspect of the present invention, the present invention provides a manufacturing method of a semiconductor apparatus including the steps of: (a) burying a first conductive portion including copper in a first insulating layer which is formed on an under layer formed above a substrate; (b) forming an additional metal film including aluminium on the first conductive portion; (c) carrying out a heat-treatment to make an alloy of copper in the first conductive portion and aluminium in the additional metal film; and (d) removing materials on the first insulating layer and the first conductive portion such that the first conductive portion is one of an interconnection and an via.

In the manufacturing method of the semiconductor apparatus of the present invention, the step (a) includes the steps of: (a1) forming a first concave portion passing through the first insulating layer to the under layer in the first insulating layer; (a2) forming a first barrier metal film on the first insulating layer and a side wall and a bottom surface of the first concave portion; and (a3) forming a first metal film on the first barrier metal film such that the rest of the first concave portion is filled with the first metal film.

In the manufacturing method of the semiconductor apparatus of the present invention, the step (b) includes the step of: (b1) forming the additional metal film on the first metal film. The step (d) includes the step of: (d1) removing the first barrier metal film, the first metal film and the additional metal film, which are processed the heat-treatment, on the first insulating layer and the first conductive portion.

In the manufacturing method of the semiconductor apparatus of the present invention, a containing percentage of alumimium in the alloy is 0.1 to 10 atm %.

In the manufacturing method of the semiconductor apparatus of the present invention, the heat-treatment is carried out in a temperature range of 200° C. to 270° C. in the step (c).

In the manufacturing method of the semiconductor apparatus of the present invention, a resistance of the alloy is lower than that of the alloy when the alloy consists of alumimium.

In the manufacturing method of the semiconductor apparatus of the present invention, an aspect ratio of the first concave portion is equal to or greater than 2.

In the manufacturing method of the semiconductor apparatus of the present invention, a width of the first conductive portion is equal to or less than 0.18 µm. A depth of the first conductive portion is equal to or greater than 0.3 µm. A thickness of the first barrier metal film is equal to or greater than 0.01 µm, such that the first metal film is formed in the first concave portion.

In the manufacturing method of the semiconductor apparatus of the present invention, the step (a) includes the steps of: (a4) forming a first concave portion passing through the first insulating layer to the under layer in the first insulating layer; (a5) forming a first barrier metal film on the first insulating layer and a side wall and a bottom surface of the first concave portion; (a6) forming a first metal film on the first barrier metal film such that the rest of the first concave portion is fill with the first metal film; and (a7) removing the first metal film on the first barrier metal film and the a conductive portion. The conductive portion includes the first barrier metal film and the first metal film.

In the manufacturing method of the semiconductor apparatus of the present invention, the step (b) includes the step of: (b2) forming the additional metal film on the first barrier metal film and the first conductive portion. The step (d) includes the step of: (d2) removing the barrier metal film and the additional metal film, which are processed the heat-treatment, on the first insulating layer and the first conductive portion.

In the manufacturing method of the semiconductor apparatus of the present invention, a containing percentage of alumimium in the alloy is 0.1 to 10 atm %.

In the manufacturing method of the semiconductor apparatus of the present invention, the heat-treatment is carried out in a temperature range of 200° C. to 270° C. in the step (c).

In the manufacturing method of the semiconductor apparatus of the present invention, a resistance of the alloy is lower than that of the alloy when the alloy consists of alumimium.

In the manufacturing method of the semiconductor apparatus of the present invention, an aspect ratio of the first concave portion is equal to or greater than 2.

In the manufacturing method of the semiconductor apparatus of the present invention, a width of the first conductive portion is equal to or less than 0.18 µm. A depth of the first conductive portion is equal to or greater than 0.3 µm. A thickness of the first barrier metal film is equal to or greater than 0.01 µm, such that the first metal film is formed in the first concave portion.

That is, by the manufacturing method of the semiconductor apparatus which used the Cu damascene method, first, the material which is Al or includes Al on Cu after the plating growth or after carried out the CMP. Next, the heat treatment is carried out at the predetermined temperature such that Al diffuses into Cu so as to makes the alloy of total solid solution. Therefore, the occurrence of the void defects can be restrained by decreasing a diffusion coefficient of the interconnection material (the alloy) and restraining a material movement between one interconnection and the other, and between the interconnection and the via. Al or a material including Al is formed not in the trench or the via hole, but on the Cu buried in the trench or the via hole. Therefore, the increase of the aspect ratio of the trench or the via hole can be restrain, and the occurrence such as the void defects which are caused by the transportation phenomenon of Cu atoms can be also restrained.

BRIEF DESCRIPTION OF THE DRAWINGS

FIG. 18 is a table showing the heat-treatment condition and a characteristic of each sample of FIGS. 8A and 8B.

DESCRIPTION OF THE PREFERRED EMBODIMENTS

Embodiments of a semiconductor apparatus and a manufacturing method of a semiconductor apparatus according to the present invention will be described below with reference to attached drawings.

FIGS. 4A to 5D are sectional views showing the embodiment of the present invention, each of which shows a part in process of the manufacturing method of the semiconductor apparatus of the present invention. FIGS. 6A to 9C are the view showing the effect of the present invention. FIG. 10 shows the relation between Al concentration in the Cu interconnection and the heat-treatment temperature.

As show in the section of "2. Description of the Related Art", it is important to improve the adhesiveness between Cu and the barrier metal and the electromigration tolerance for forming the fine Cu interconnections. Therefore, there is the method of forming the upper layer barrier metal film 18b such as Al on the under layer barrier metal film 18a such as TiN, which is disclosed on the patent application above. By this method, the adhesiveness between Cu and a barrier metal can be improved. On the other hand, the aspect ratio of the trench and the via hole increase. Therefore, there is a problem that it becomes difficult for Cu to be buried in the trench and the via hole as mentioned before.

Figure 6A:
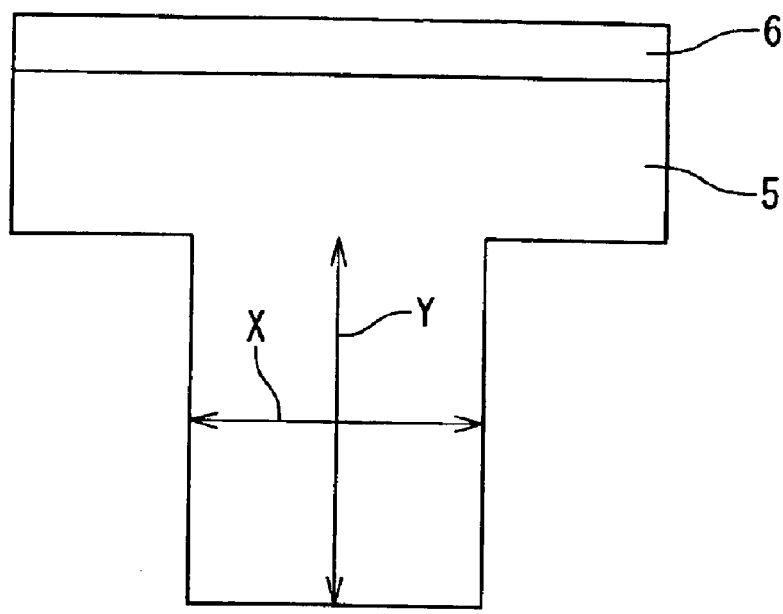
FIGS. 6A and 6B are schematic sectional views showing the aspect ratio.
Figure 6B:
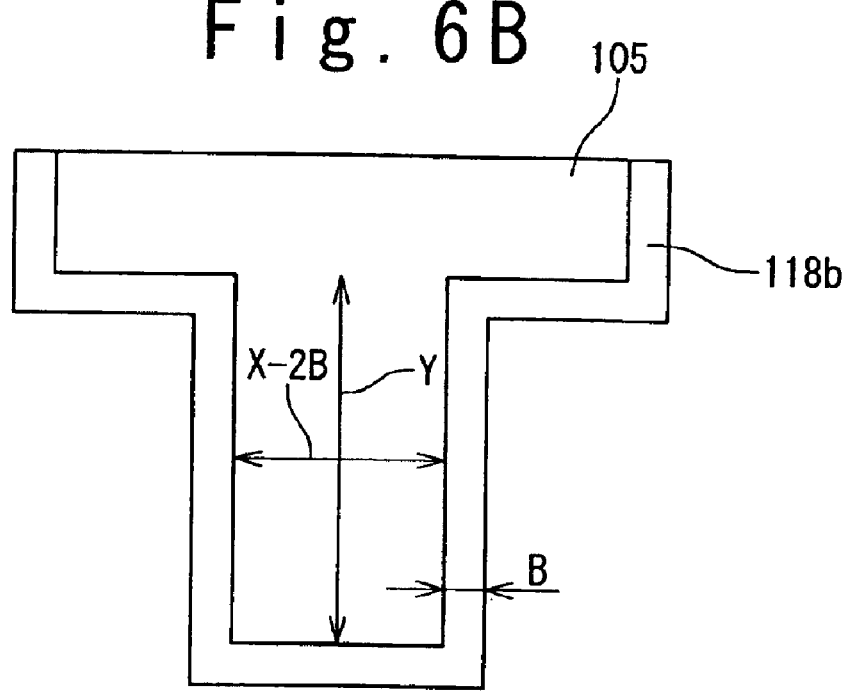

It is concretely explained below. FIGS. 6A and 6B are schematic sectional views showing the change of the aspect ratio. As shown in FIG. 6A, the aspect ratio is Y/X. Here, the X is the width of the area in the trench and the via hole that Cu (5) can be buried after forming the barrier metal (4, 14, not shown in FIG. 6A) of TiN. The Y is the depth of the area in the trench and the via hole that Cu can be buried after forming the barrier metal of TiN. However, as shown in FIG. 6B, after forming the upper barrier metal (118b) of Al with the thickness of B on the barrier metal (118a not shown in FIG. 6B) of TiN, the aspect ratio has increased to Y/(X−2B). Here, the depth of the area that Cu (105) can be buried does not change. However, the width decreases in X−2B.

Generally, the aspect ratio that Cu can be buried in is about 2. Supposing that the interconnection width (X) is equal to or less than 0.18 $\mu$m and the interconnection thickness (Y) is equal to or more than 0.3 $\mu$m, the thickness B of the upper layer barrier metal film 118b can not be equal to or more than 0.01 $\mu$m formed. Therefore, the technique of the patent application above-mentioned can not be applied to the fine interconnection of which the minimum width is equal to or less than 0.18 $\mu$m.

Also, even if Cu can be buried, the difference occurs to the entropy, based on the difference of the crystallinity of Cu in the wide interconnection and the fine interconnection. Therefore, when the heat-treating after forming the interconnections, with balancing of entropy, Cu atoms move from the fine interconnection or the fine via to the wide interconnection (the transportation phenomenon). As a result, the void defect 19 occurs in the fine interconnection or the fine via.

To restrain a transportation phenomenon problem, the diffusion coefficient of the interconnection material must be made small. Therefore, the inventor examines the method of making interconnection material alloy to make a diffusion coefficient small.

It is good for the interconnection material to alloy Cu with other metallic material. However, the material supplied to Cu should be the material which becomes an alloy with Cu and which becomes an alloy at the low temperature. By forming the alloy at low temperature, the MOS transistor which is formed by the layer lower than the layer including the interconnection can be prevented from the thermal damage caused by the alloy forming process. Also, the reliability of the interconnection degrades if the material generates deposits during the alloy forming process. Therefore, the material should be alloyed with Cu in any ratio. That is, the material should become the solid solution with Cu in any ratio. Moreover, the strength improves generally but the electric conductivity falls when the metal makes an alloy with other metal. Therefore, raising the mechanical strength which the LSI needs without being influenced on the electric conductivity of Cu is important. It is found that Al is suitable for the material to make an alloy with Cu, because it can be alloyed with Cu at low temperature and it can make the solid solution in any ratio with Cu.

In case of forming Al film on the barrier metal such as TiN by using the structure in the patent application above-mentioned (FIG. 6B) as the method of supplying Cu with Al, the aspect ratio of the trench and the via hole increases and Cu being buried has become difficult as explained above.

Also, when the heat-treating for making alloy, Cu in the via part is pulled from the interconnection part with the big interconnection area (or the volume of the interconnection area). Therefore, it is found that an alloy of Cu and Al with uniform properties can not be obtained by using the method in the patent application above-mentioned.

Therefore, in the present invention, as the method of supplying Al with Cu, Al is formed not in the trench nor the via hole, but on the Cu buried in the trench or the via hole. Then, by carrying out the heat-treatment, both making the alloy of Cu and Al and avoiding the degradation of the property of Cu being buried can be achieved at the same time as shown in FIGS. 4A to 5D. Hereinafter, it is explained in detail with reference to the drawings.

FIG. 4 shows the sectional view of the method of carrying out a CMP after alloy forming in the embodiment of the manufacturing method of the semiconductor apparatus of the present invention.

Figure 4A:
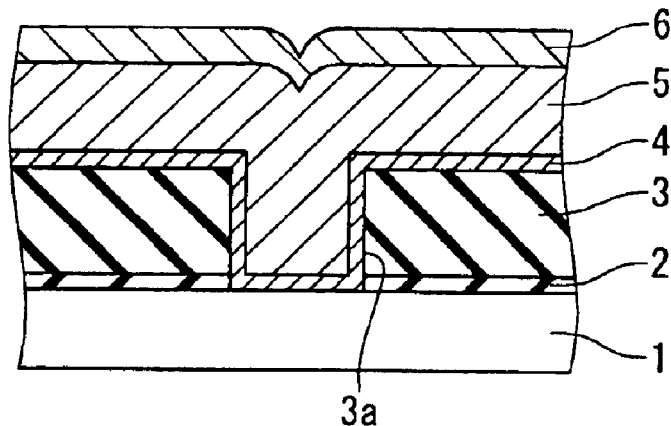
FIGS. 4A to 4C are sectional views showing the embodiment of the present invention.

First, as shown in FIG. 4A, the first etch stopping film 2 and the first inter-level dielectric 3 are formed on the substrate 1 by this order. Here, as for the substrate 1, semiconductor devices such as MOS transistors are formed on the semiconductor substrate and an insulating layer may be formed on the semiconductor devices and the substrate. The layer with semiconductor devices and/or the insulating layer on them is referred to as an under layer.

The first etch stopping film 2 is a film such as SiN which stops etching when forming a trench. The first inter-level dielectric 3 is a film such as SiO2 which has mechanical strength to the CMP. The first etch stopping film 2 and the first inter-level dielectric 3 are referred to as a first insulating layer.

Next, the resist pattern is formed on the first inter-level dielectric 3 as a mask for the conventional dry etching. The first trench 3a is formed by (dry) etching the first inter-level dielectric 3 and the first etch stopping film 2. The first trench 3a is referred to as a first concave portion.

Next, the first barrier metal film 4 and the seed metal (not shown) are formed on the first inter-level dielectric 3 and in the first trench 3a by the sputtering method. Here, the first barrier metal film 4 is a barrier film such as Ta/TaN and TiN to prevent from the diffusion of the interconnection material. The seed metal (not shown) is a film to facilitate the plating growth of Cu which becomes the interconnection material. Next, the Cu 5 is formed by the electrolysis plating method on the seed metal. Then, the Al 6 or the material including Al (for example, AlCu which includes Cu by about 0.5%, and so on) is formed on the Cu 5.

Figure 4B:
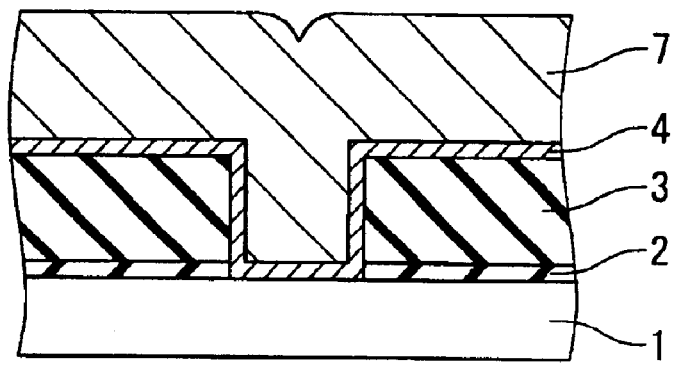

As for the situation of FIG. 4A, the heat-treatment is carried out at predetermined temperature. As a result, the Cu 5 is alloyed with the Al 6 completely so as to be the solid solution as the Cu—Al alloy 7. This situation is shown in FIG. 4B.

Figure 4C:
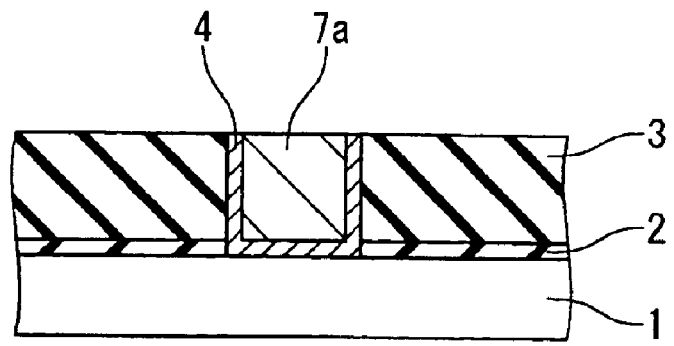

Then, the Cu—Al alloy 7 and the first barrier metal film 4 on the first inter-level dielectric 3 are removed by the CMP method. As a result, the first Cu—Al interconnection 7a is formed in the first trench 3a. The first Cu—Al interconnection 7a is referred to as a first conductive portion. The portion of the first Cu—Al interconnection 7a without the first barrier metal film 4 is referred to as a first metal portion. This situation is shown in FIG. 4C.

After that, by repeating similar processes, a semiconductor apparatus with the desirable multi-level interconnection structure is formed.

FIG. 5 shows the sectional view of the method of alloy forming after carrying out a CMP in the embodiment of the manufacturing method of the semiconductor apparatus of the present invention.

Figure 5A:
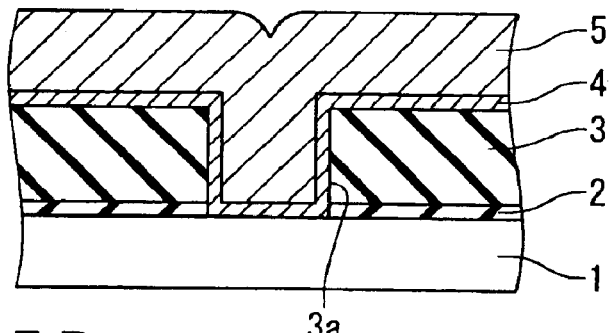
FIGS. 5A to 5D are sectional views showing the embodiment of the present invention.

First, as shown in FIG. 5A, the first etch stopping film 2 such as SiN and the first inter-level dielectric 3 such as SiO2 are formed on the substrate 1 by this order. Next, the resist pattern is formed on it as a mask for the dry etching. The first trench 3a is formed by (dry) etching the first inter-level dielectric 3 and the first etch stopping film 2. After that, the first barrier metal film 4 and the seed metal (not shown) is formed on the first inter-level dielectric 3 and in the first trench 3a by the sputtering method. Then, the Cu 5 is formed by the electrolysis plating method on the seed metal.

Figure 5B:
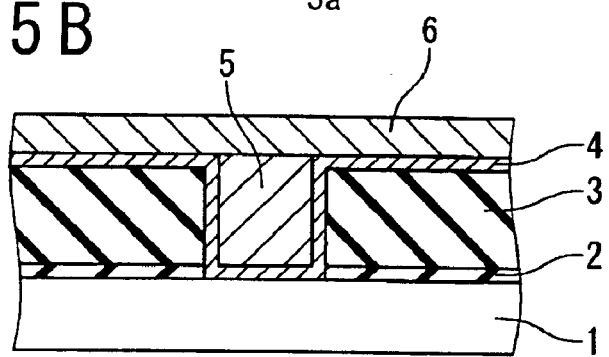
Figure 5C:
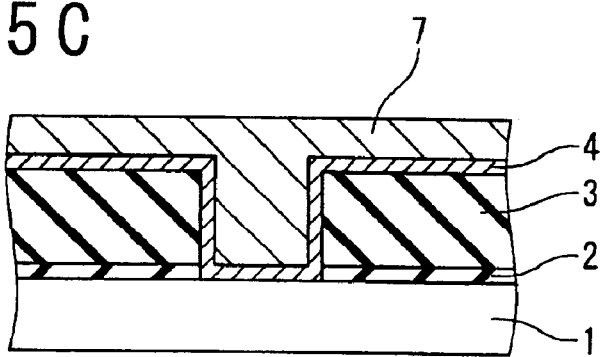

As for the situation of FIG. 5A, the Cu 5 on the first barrier metal film 4 is removed by the CMP method. Next, the Al 6 or the material including Al is formed on the first barrier metal film 4. This situation is shown in FIG. 5B. Then, the heat-treatment is carried out at predetermined temperature. As a result, the Cu 5 in the first trench 3a is alloyed with the Al 6 completely so as to be the solid solution as the Cu—Al alloy 7. This situation is shown in FIG. 5C.

Figure 5D:
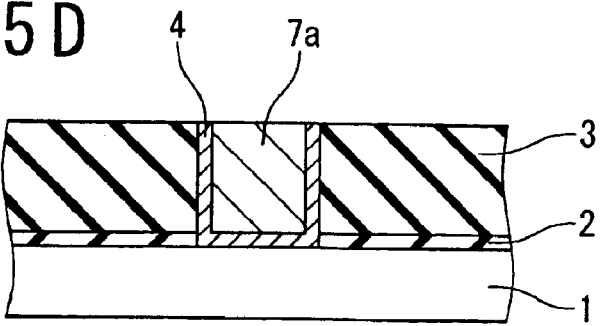

Then, the Cu—Al alloy 7 and the first barrier metal film 4 on the first inter-level dielectric 3 are removed by the CMP method. As a result, the first Cu—Al interconnection 7a is formed in the first trench 3a. This situation is shown in FIG. 5D.

After that, by repeating similar processes, a semiconductor apparatus with the desirable multi-level interconnection structure is formed.

By using these methods, without degrading the properties of Cu being buried, the alloy of Cu and Al can be simply and surely formed. With it, the decrease of the reliability caused by the void defect can be prevented.

However, the Al content in the alloy, which is related to the thickness of the Al 6 or the material including Al formed on the Cu 5 and the heat-treatment condition, affects the effects of the present invention. Therefore, the following examination was carried out to set the desirable Al content and the desirable heat-treatment condition.

As for the Al content ratio, when the Al content is too low, the decrease of the diffusion coefficient is not enough. In this case, the sufficient restraint effect of the transportation phenomenon can not be obtained. To the contrary, when the Al content is too high, the resistance is substantially equal to that of Al. In this case, the merit of using the Cu interconnection will be disappeared.

Figure 7:
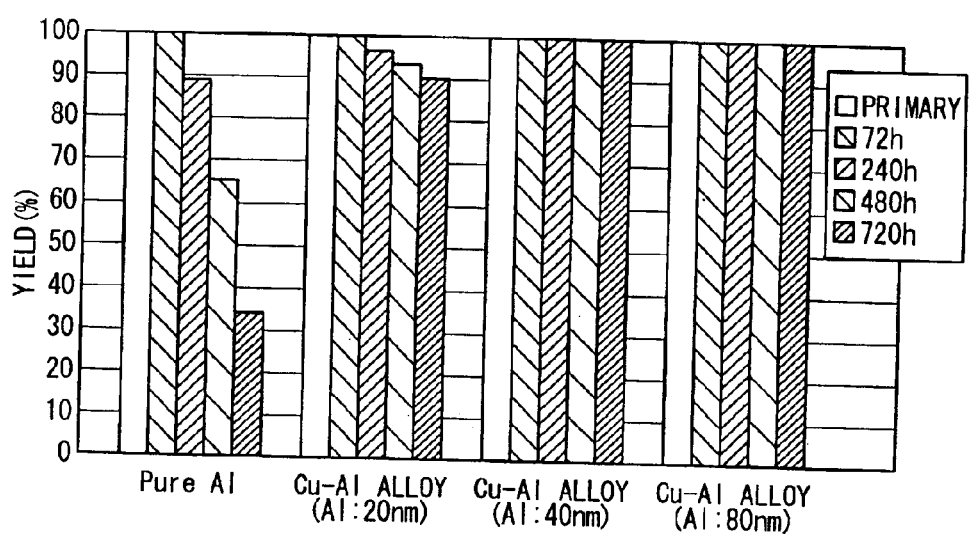
FIG. 7 is a graph showing the relation among the Al content, the yield and the heat-treatment time.

FIG. 7 is the graph showing the relation among the Al content, the yield and the heat-treatment time. Here, the horizontal axis shows the samples which are different from each other in the Al content. The vertical axis shows the yield for fair quality products. Each bar corresponds to the heat-treatment time as shown in the box drawn in the right side of the graph. The film thickness of Cu is 700 nm. As shown in FIG. 7, there is no effect to the yield when alloying Cu with Al which is equal to or less than 20 nm of Al film thickness. On the other hand, there is the effect to improve the yield when alloying Cu with Al which is equal to or more than 40 nm of Al film thickness. In this case, the containing percentage of Al in the Cu with 40 nm Al (Cu—Al (Al:40 nm) in FIG. 7) was 0.1 atm %. Therefore, the containing percentage of Al in the alloy should be equal to or more than 0.1 atm %.

Also, the mechanical strength rises when making Cu alloy but the electric conductivity decreases. Therefore, the Al content must be provided from the viewpoint to suppress the decrease of the electric conductivity of the interconnection material in the latitude and moreover to achieve the mechanical strength which the LSI needs.

To examine the Al content, the samples (No.1–7 and the reference) were prepared by the following method. First, the Cu films of 0.7 $\mu$m was formed by the electrolysis plating. Then, they were alloyed with the Al film of 60–100 nm by the heat-treatment in the various conditions to be the samples. Then, the resistivity and the sheet resistance of each sample are measured. The result is shown in FIGS. 8A, 8B and 18.

Figure 8A:
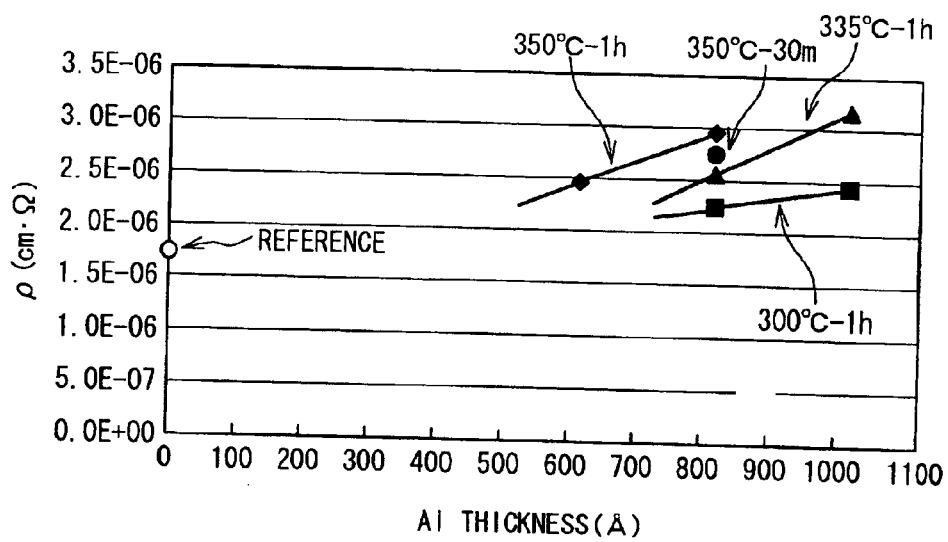
FIG. 8A is a graph showing the relation among the Al film thickness, the resistivity and the heat-treatment condition.

FIG. 8A is the graph showing the relation among the Al film thickness, the resistivity and the heat-treatment condition. Here, the horizontal axis is Al film thickness. The vertical axis is the resistivity of each sample. The open circle shows the reference sample. The solid circle shows the samples of which the heat-treatment condition is 350° C. (degree centigrade) in 30 min. The solid rhombus shows the samples of which the heat-treatment condition is 350° C. in an hour. The solid triangle shows the samples of which the heat-treatment condition is 335° C. in an hour. The solid square shows the samples of which the heat-treatment condition is 300° C. in an hour.

Figure 8B:
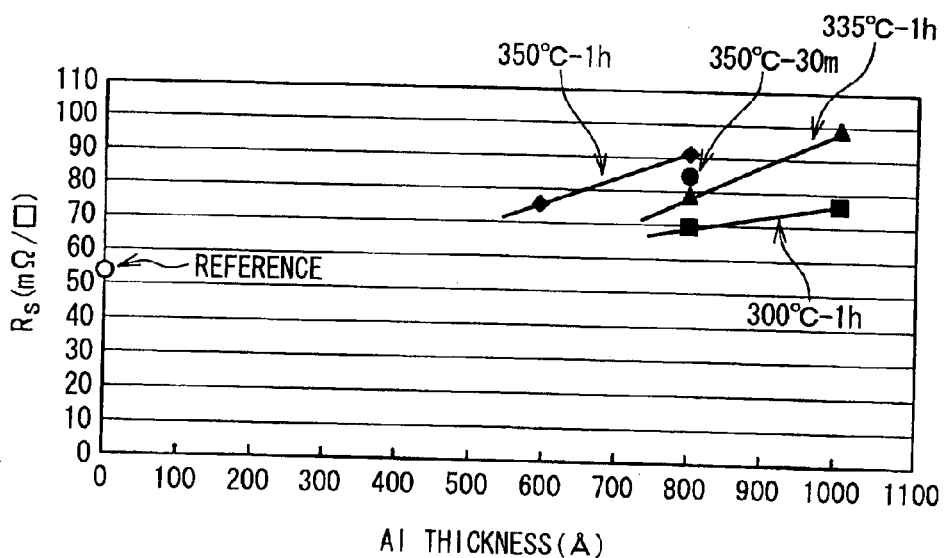
FIG. 8B is the graph showing the relation among the Al film thickness, the sheet resistance and the heat-treatment condition.

FIG. 8B is the graph showing the relation among the Al film thickness, the sheet resistance and the heat-treatment condition. The meaning of the symbols of the FIG. 8B is the same as that of the FIG. 8A.

FIG. 18 is a table showing the heat-treatment condition and a characteristic of each sample of FIGS. 8A and 8B.

Generally, to promote to make alloy, it is more desirable that the heat-treatment temperature is higher. However, the bad influence is expected on the device like the MOS transistor which is formed under the layer with the interconnection when the heat-treatment temperature is high too much. Also, as shown in FIGS. 8A, 8B and 18, it is found that the resistance increases as that the temperature of the heat-treatment is high. Therefore, the heat-treatment temperature must be suppressed low, too.

In FIGS. 8A and 8B, the resistance is not strongly depended on the film thickness in case of 300° C. In this heat-treatment condition, the increase of the resistance is suppressed when the Al content increases. That is, it is desirable that the heat-treatment temperature is equal to or less than 300° C.

Moreover, if the resistance of the Cu—Al alloy becomes about 1.5 times as the resistance of only Cu by the heat-treatment, the resistance of the Cu—Al alloy becomes equal to the resistance of Al. In this case, the merit of using Cu for the interconnection disappears. Therefore, the film thickness of Al is thicker than 1000 Å is unsuitable. Because if the resistivity and the sheet resistance of Al which is 1000 Å of the film thickness are converted to 3200 Å of the film thickness, they become about 1.5 times as resistance and the sheet resistance of the reference. That is, it is desirable that the Al film thickness is equal to or less than 1000 Å. It is also desirable that the containing percentage of Al in the alloy is less than 10 atm % from the viewpoint of the electric conductivity. Because 1000 Å of the film thickness of Al corresponds to 10 atm % of the containing percentage of Al in the alloy (interconnection).

Moreover, at the temperature higher than or equal to 270° C., Cu softens and the transportation phenomenon happens. Therefore, it is desirable that the heat-treatment temperature is equal to or less than 270° C.

FIG. 10 is a graph showing the relation between the heat-treatment temperature and Al concentration in the Cu interconnection. The horizontal axis shows the heat-treatment temperature. The vertical axis shows Al concentration. It is found that more than 0.1 atm % of Al can be contained in the Cu interconnection at the heat-treatment temperature of equal to or more than 200° C. as shown in FIG. 10. Therefore, the temperature range from 200° C. to 270° C. is appropriate to the heat-treatment temperature.

To confirm that Cu is alloyed with Al in case of the above experiments, the depth profiles of Cu and Al in the sample No.1, the sample No.2 and the sample No.5 are measured by the SIMS. Here, the sample No.1 is the sample that the Al film thickness is 600 Å, the heat-treatment condition is 350° C. in 60 minutes. The Sample No.2 is the sample that the Al film thickness is 800 Å, the heat-treatment condition is 350° C. in 60 minutes. The Sample No.5 is the sample that the Al film thickness is 800 Å, the heat-treatment condition is 350° C. in 30 minutes. The result is shown in FIG. 9.

Figure 9A:
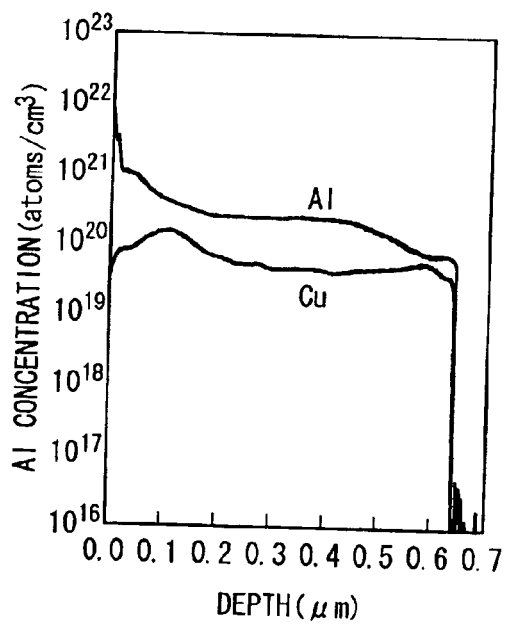
FIGS. 9A, 9B and 9C are graphs showing the depth profiles of Al and Cu in the sample No.1, No.2 and No.5, respectively.
Figure 9B:
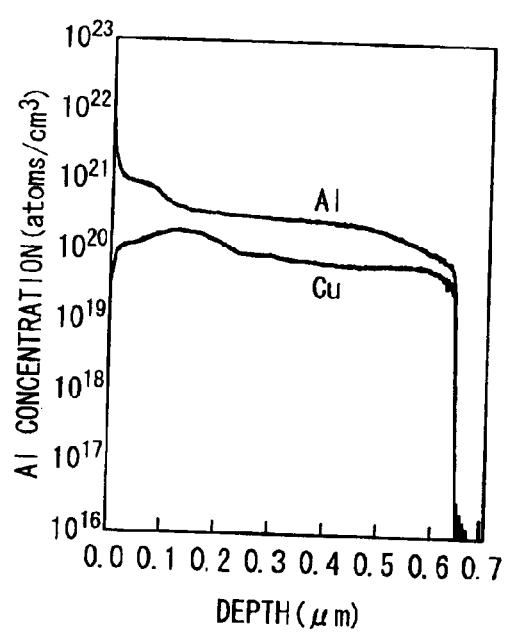
Figure 9C:
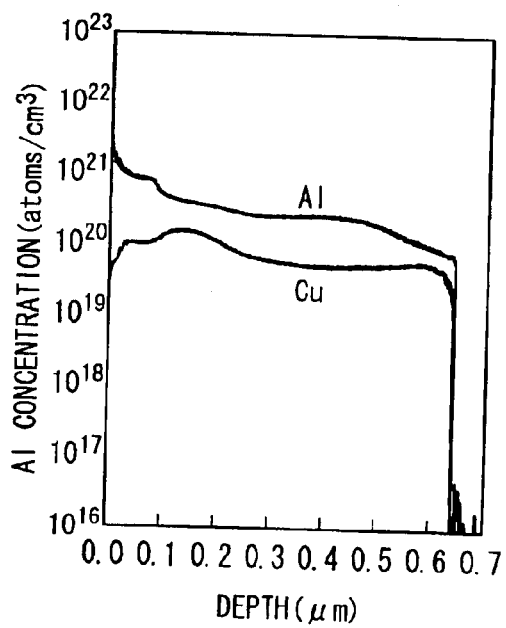
Figure 10:
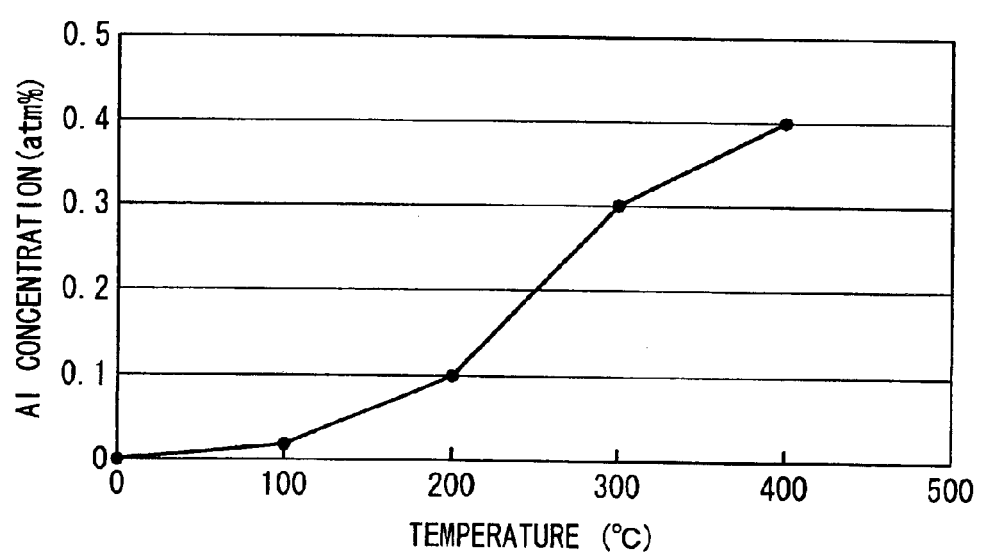
FIG. 10 is s graph showing the relation between the heat-treatment temperature and Al concentration in the Cu interconnection.

FIGS. 9A, 9B and 9C are the graphs showing the depth profiles of Al and Cu in the sample No.1, No.2 and No.5, respectively. The horizontal axis shows the depth from the surface of each sample. The vertical axis shows the concentration of each element. As shown in FIGS. 9A to 9C, Al is uniformly distributed to the direction of the depth in each sample. It is found that the interconnection can be made alloy not only at the surface but also in the whole interconnection and whole via by the method of the present invention.

Cu can be alloyed with Al at the low temperature so as to make the solid solution by carrying out the heat-treatment to the Cu and the Al (or the material including Al). Here, the Cu is formed in the trench or the via hole by the electric plating method. The Al (or the material including Al) is formed on the Cu by the sputtering method. Therefore, The material movement can be suppressed by reducing the diffusion coefficient of the interconnection material. As a result, the occurrence of the void defect which accompanies the balancing of entropy when performing the heat-treatment after forming the interconnection can be prevented. Hence, the reliability of the interconnection can be improved. Also, by forming Al or the material including Al not under the Cu interconnections, but on them, the increase of the aspect ratio of the trench or the via hole can be prevented. That is, the property of Cu being buried is never degraded, and also the generation of the void defect by failure of Cu being buried can be prevented. Moreover, it is not necessary to use the equipment having the good property of Cu being buried, because Al or the material including Al is formed on Cu, which is in the under layer than the layer that Al is formed. Then, this method of the present invention can be applied to the miniaturization of the interconnections and the vias of which sizes are equal to or less than 0.2 μm.

Figure 19:
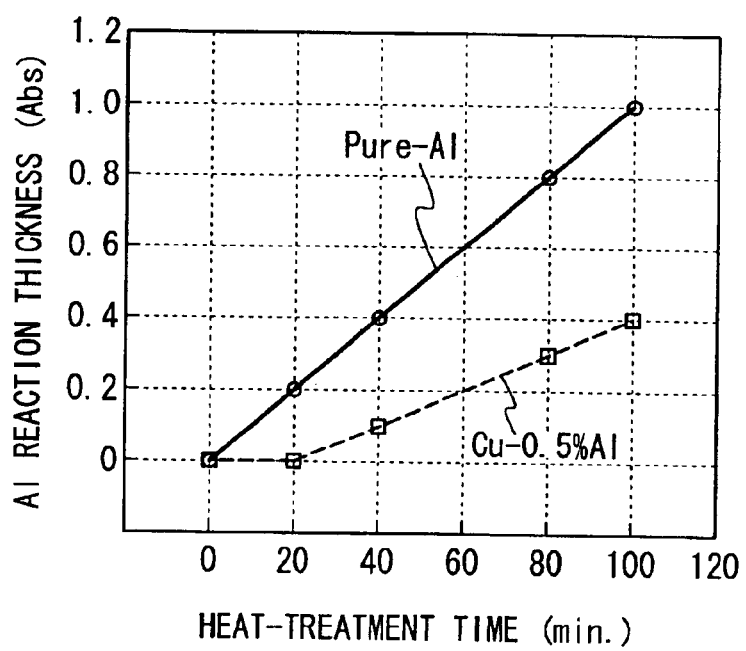
FIG. 19 is s graph showing the relation between the heat-treatment time and Al reaction thickness in the Cu interconnection.

FIG. 19 is s graph showing the relation between the heat-treatment time and Al reaction thickness in the Cu—Al alloy, when carrying out the process for making a Cu—Al alloy such as FIG. 4B or 5C. The horizontal axis shows the heat-treatment time. The vertical axis shows Al reaction thickness is the Cu interconnection. Here, the curve of "Pure-Al" (open circles) shows that Al source like the Al 6 of FIGS. 4A and 5B for the Cu—Al alloy is pure Al. The curve of "Cu-0.5% Al" (open squares) shows that Al source for the Cu—Al alloy is Cu with 0.5% Al. As shown in FIG. 19, when using Cu with 0.5% Al, instead of pure Al shown in FIGS. 4A and 5B, Al reaction thickness of Cu with 0.5% Al is thinner than that of pure Al. Therefore, when metal except Al is contained in Al, the reaction to Cu in the Cu interconnection becomes slower than that of pure Al and the uniformity of the Cu—Al alloy becomes worse. Hence, Al source is desirable to be pure Al rather than alloy of Al and other metal.

The examples of the above-explained embodiment are explained in more detail with reference to the drawings.
[The First Example]

FIGS. 11 to 14 shows the sectional view of the first example of the above-explained embodiment. In this case, the alloy making processing of the present invention is applied to the single damascene process.

Figure 11A:
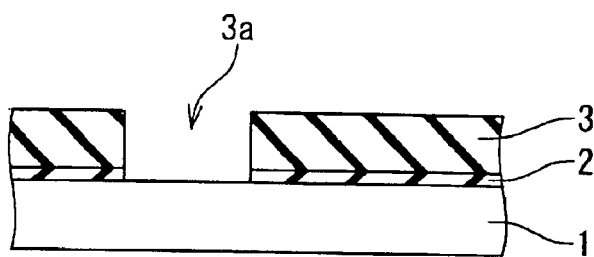
FIGS. 11A to 11E are sectional views showing the part of the first example of the embodiment.

First, as shown in FIG. 11A, the first etch stopping film 2 and the first inter-level dielectric 3 are formed on the substrate 1 by this order by using the CVD method. Here, as for the substrate 1, MOS transistors and the like are formed. Next, the antireflective film to restrain exposure reflection and the chemically amplified resist are coated on the first inter-level dielectric 3. Then, the exposure and development by the KrF photolithography method are carried out such that the resist pattern (not shown) is formed for the first trench 3a. Next, the first trench 3a is formed by (dry) etching the first inter-level dielectric 3 and the first etch stopping film 2. The first trench 3a penetrates the first inter-level dielectric 3 and the first etch stopping film 2. After that, the resist pattern and the antireflective film are removed by the oxygen plasma ashing and the wet processing which uses the organic remover such that the residue of the dry etching is eliminated. Incidentally, the materials of the first etch stopping film 2 and the first inter-level dielectric 3 are not limited to the specific materials. They may be selected from the sets of the materials which have enough selection ratio for dry etching. These materials are selected from SiO2, SiN, SiON, SiC and the low dielectric film and so on.

Figure 11B:
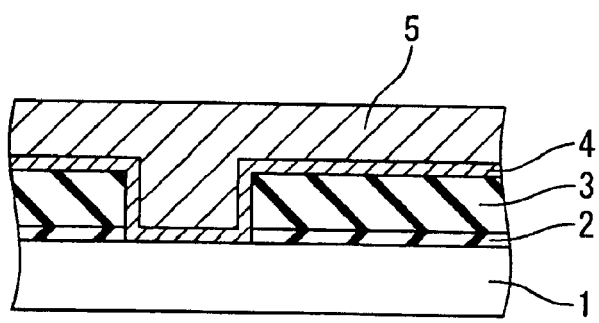

As for the situation of FIG. 11A, the first barrier metal film 4 is formed on the first inter-level dielectric 3 and in the first trench 3a by the sputtering method. The first barrier metal film 4 is composed of the single layer film of Ti, TiN, Ta, TaN, WN and the like or the double or more layer film combined them. The first barrier metal film 4 is exemplified by the Ta/TaN of about 20 nm/20 nm in the film thickness. Next, the seed metal (not shown) of 100 nm is formed on the first barrier metal film 4 by the sputtering method. Next, the Cu 5 of 600 nm is formed by the electrolysis plating method such that Cu is buried in the first trench 3a. This situation is shown in FIG. 11B.

Figure 11C:
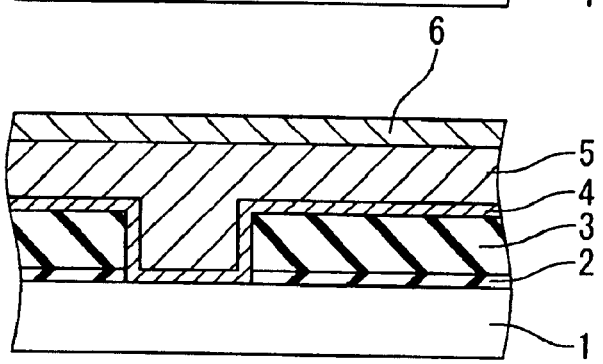

Next, the processes for making alloy are carried out. As mentioned before, Al is suitable for the material to make an alloy with Cu. Here, the Al 6 or the material including Al of 60 nm is formed on the Cu 5. This situation is shown in FIG. 11C.

Figure 11D:
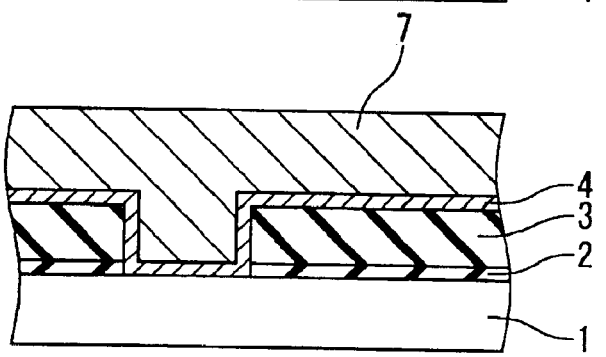

After that, the heat-treatment is carried out for forming alloy. As mentioned before, the heat-treatment temperature is preferably from 200° C. to 270° C, and more preferably 250° C. to 270° C. As a result, the Cu 5 is alloyed with the Al 6 completely so as to be the solid solution as the Cu—Al alloy 7. This situation is shown in FIG. 11D.

Then, the Cu—Al alloy 7 and the first barrier metal film 4 on the first inter-level dielectric 3 are removed by the CMP method. As a result, the first Cu—Al interconnection 7a is formed in the first trench 3a. This situation is shown in FIG. 11E.

Figure 1A:
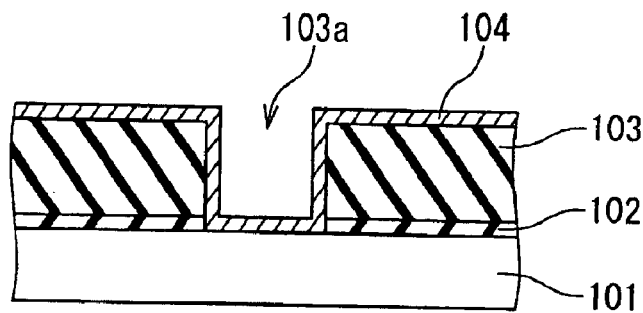
FIGS. 1A to 1C are sectional views showing the part of the conventional damascene process.
Figure 1B:
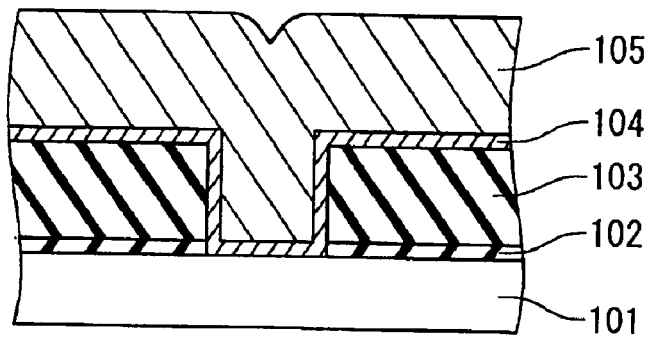

Incidentally, the method of the alloy forming after carrying out a CMP is also available as mentioned in FIGS. 5A to 5D. First, as for the situation of FIG. 11B, the Cu 5 on the first barrier metal film 4 is removed by the CMP method. Next, the Al 6 or the material including Al is formed on the first barrier metal film 4. Next, the heat-treatment is carried out for forming alloy. As a result, the Cu 5 in the first trench 3a is alloyed with the Al 6 completely so as to be the solid solution as a Cu—Al alloy 7. After that, the Al 6 and the first barrier metal film 4 on the first inter-level dielectric 3 are removed by the CMP method. As a result, the first Cu—Al interconnection 7a is formed in the first trench 3a. This situation is the same as that shown in FIG. 1E.

Figure 11E:
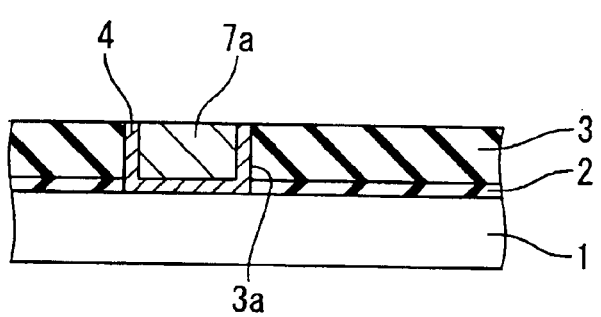

As shown in FIG. 11E, the second etch stopping film 8 and the second inter-level dielectric 9 are formed on the first inter-level dielectric 3 and the first Cu—Al interconnection 7a by this order by using the CVD method. Next, the antireflective film and the chemically amplified resist are coated on the second inter-level dielectric 9. Then, the exposure and development by the KrF photo lithography method are carried out such that the resist pattern (not shown) is formed for the via hole 9a. Next, the via hole 9a is formed by (dry) etching the second inter-level dielectric 9 and the second etch stopping film 8. The via hole 9a penetrates the second inter-level dielectric 9 and the second etch stopping film 8. After that, the resist pattern and the antireflective film are removed by the oxygen plasma ashing and the wet processing which uses the organic remover such that the residue of the dry etching is eliminated. Incidentally, the materials of the second etch stopping film 8 and the second inter-level dielectric 9 are not limited to the specific materials. They may be selected from the sets of the materials which have enough selection ratio for dry etching. These materials are selected from SiO2, SiN, SiON, SiC and the low dielectric film and so on. This situation is shown in FIG. 12A.

Figure 12A:
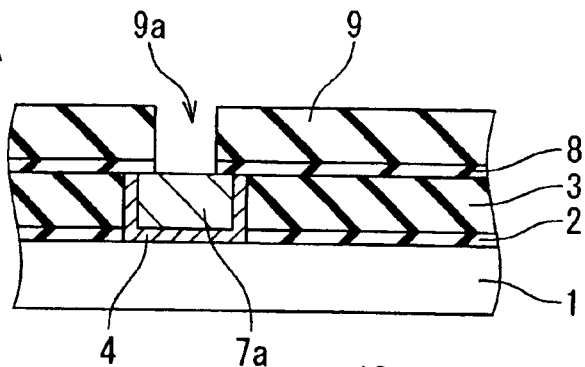
FIGS. 12A to 12D are sectional views showing the part of the first example of the embodiment.
Figure 12B:
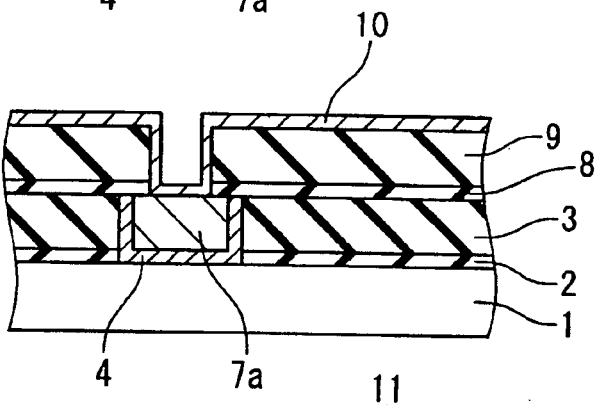

As for the situation of FIG. 12A, the second barrier metal film 10 is formed on the second inter-level dielectric 9 and in the via hole 9a by the sputtering method. The second barrier metal film 10 is composed of the single layer film of Ti, TiN, Ta, TaN, WN and the like or the double or more layer film combined them. The second barrier metal film 10 is exemplified by the Ta/TaN of about 20 nm/20 nm in the film thickness. This situation is shown in FIG. 12B.

Figure 12C:
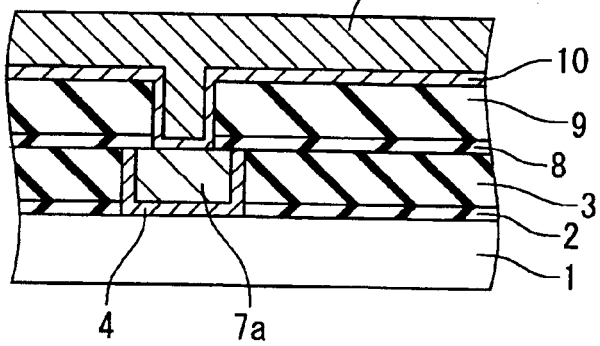

Next, the seed metal (not shown) of 100 nm in the film thickness is formed on the second barrier metal film 10 by the sputtering method. Then, the Cu 11 of 600 nm is formed by the electrolysis plating method such that Cu is buried in the via hole 9a. This situation is shown in FIG. 12C.

After that, the processes for making alloy may be carried out as explained in FIG. 11C. However, to restrain the material transportation between the interconnections, it is enough that any one of the interconnections which is adjacent each other is alloyed. Also, to restrain the material transportation between the interconnection and the via, it is enough that any one of the interconnection and the adjacent via is alloyed. Therefore, it is not necessary to alloy all interconnections and via.

For example, when the wide interconnection and the fine interconnection (for example, the area ratio is 20:1 or more) are connected to each other, it is desirable to alloy Cu included in at least one of these interconnections. Also, when the wide interconnection and the fine via (for example, the area ratio is 20:1 or more) are connected to each other, it is desirable to alloy Cu included in at least one of the interconnection and the via.

However, the materials transportation between the interconnections is hard to occur, when the area ration between the interconnections is not big enough. In this case, sometimes, it is not desirable to form the alloy when the increase of the resistively should be prevented. Therefore, it is not always desirable to form the alloy for the interconnection. Hence, it is desirable to consider the laying-out of the whole semiconductor apparatus and the preferable characteristic of the semiconductor apparatus and so on, and then to set which interconnections or vias is alloyed.

Figure 12D:
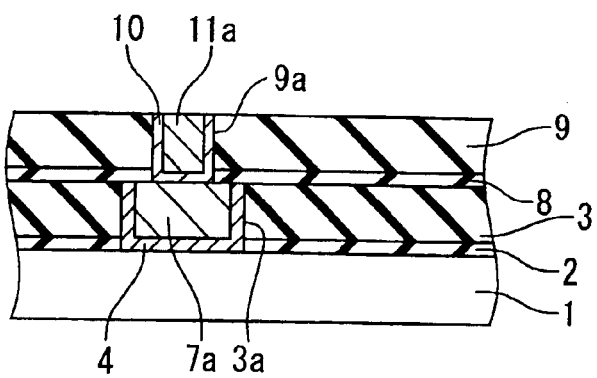

As for the situation of FIG. 12C, the Cu 11 and the second barrier metal film 10 on the second inter-level dielectric 9 is removed by the CMP method. Then, the via 11a which is connected to the first Cu—Al alloy interconnection 7a is formed in the second inter-level dielectric 9. This situation is shown in FIG. 12D.

Figure 13A:
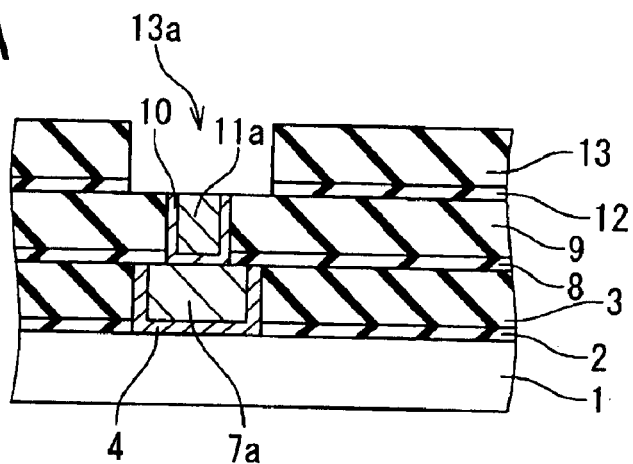
FIGS. 13A to 13C are sectional views showing the part of the first example of the embodiment.

Next, the third etch stopping film 12 and the third inter-level dielectric 13 are formed on the second inter-level dielectric 9 and the via 11a by this order by using the CVD method. Then, the antireflective film and the chemically amplified resist are coated on the third inter-level dielectric 13. After that, the exposure and development by the KrF photolithography method are carried out such that the resist pattern (not shown) is formed for the second trench 13a. Next, the second trench 13a is formed by (dry) etching the third inter-level dielectric 13 and the third etch stopping film 12. The second trench 13a penetrates the third inter-level dielectric 13 and the third etch stopping film 12. After that, the resist pattern and the antireflective film are removed by the oxygen plasma ashing and the wet processing which uses the organic remover such that the residue of the dry etching is eliminated. Incidentally, the materials of the third etch stopping film 12 and the third inter-level dielectric 13 are not limited to the specific materials. They may be selected from the sets of the materials which have enough selection ratio for dry etching. These materials are selected from SiO2, SiN, SiON, SiC and the low dielectric film and so on. This situation is shown in FIG. 13A.

Figure 13B:
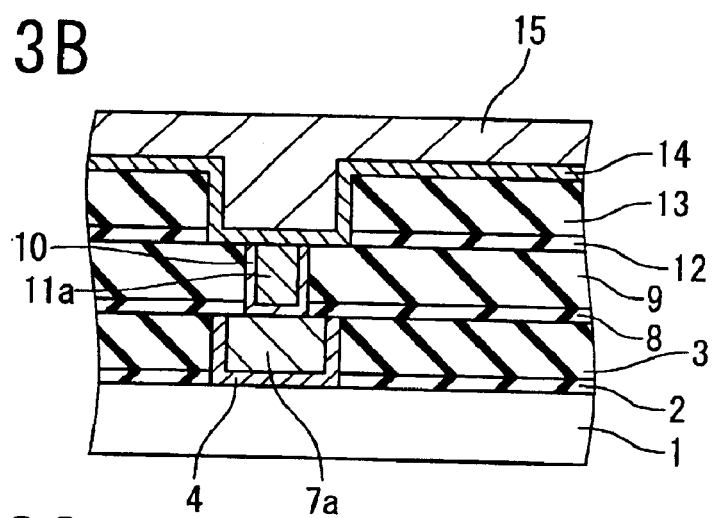

Next, the third barrier metal film 14 is formed on the third inter-level dielectric 13 and in the second trench 13a by the sputtering method. The third barrier metal film 14 is composed of the single layer film of Ti, TiN, Ta, TaN, WN and the like or the double or more layer film combined them. The third barrier metal film 14 is exemplified by the Ta/TaN of about 20 nm/20 nm in the film thickness. Next, the seed metal (not shown) of 100 nm is formed on the third barrier metal film 14 by the sputtering method. Next, the Cu 15 of 600 nm is formed by the electrolysis plating method such that Cu is buried in the second trench 13a. This situation is shown in FIG. 13B.

Figure 13C:
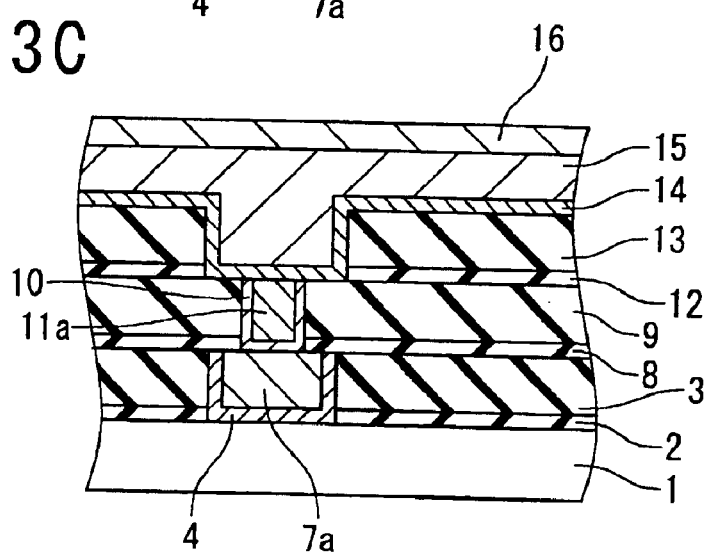

After that, the processes for making alloy are carried out. The Al 16 or the material including Al of 60 nm is formed on the Cu 15. This situation is shown in FIG. 13C.

Figure 14A:
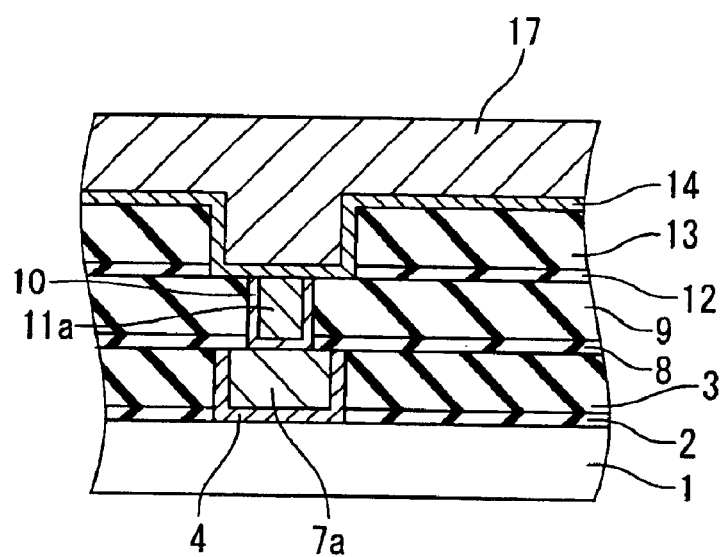
FIGS. 14A to 14B are sectional views showing the part of the first example of the embodiment.

Next, the heat-treatment is carried out for forming alloy. As explained in the FIG. 11C, the heat-treatment temperature is preferably from 200° C. to 270° C., and more preferably 250° C. to 270° C. As a result, the Cu 15 is alloyed with the Al 16 completely so as to be the solid solution as the Cu—Al alloy 17. This situation is shown in FIG. 14A.

Figure 14B:
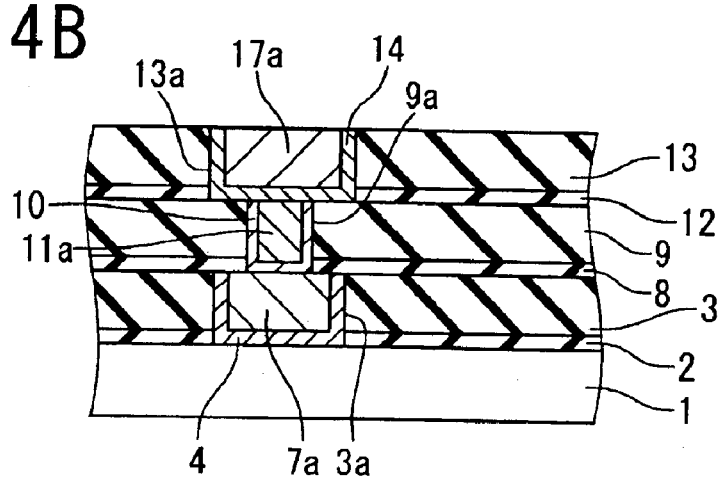

Next, the Cu—Al alloy 17 and the third barrier metal film 14 on the third inter-level dielectric 13 are removed by the CMP method. As a result, the second Cu—Al interconnection 17a is formed in the second trench 13a. This situation is shown in FIG. 14B.

After that, by repeating similar processes, a semiconductor apparatus with the desirable multi-level interconnection structure is formed.

In this way, according to the manufacturing method of the semiconductor apparatus of the present invention, the Cu—Al alloy is formed by the heat-treatment after forming the Al or includes Al on Cu buried in the trench or the via hole. Therefore, the occurrence of the void defects and the decrease of the reliability in the conventional technique can be restrained by restraining a material movement between one interconnection to another, and between the interconnection and the via. Al or a material including Al is formed not in the trench or the via hole, but on the Cu buried in the trench or the via hole. Therefore, the degradation of the property of Cu being buried can be prevented. Also, the occurrence such as the void defects which are caused by the transportation phenomenon of Cu atoms can be also restrained.

[The Second Example]

FIGS. 15 to 17 shows the sectional view of the second example of the above-explained embodiment. In this case, the alloy making processing of the present invention is applied to the via first dual damascene process.

The explanation of the processes in FIGS. 15A to 15E is omitted, because these processes of FIGS. 15A to 15E are the same as those of FIGS. 11A to 11E.

Figure 15A:
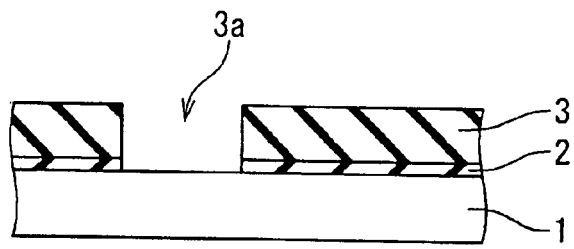
FIGS. 15A to 15E shows sectional views showing the part of the second example of the embodiment.
Figure 15B:
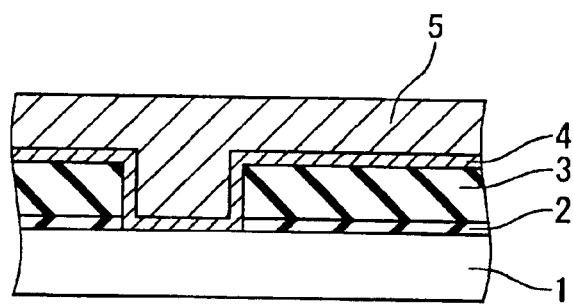
Figure 15C:
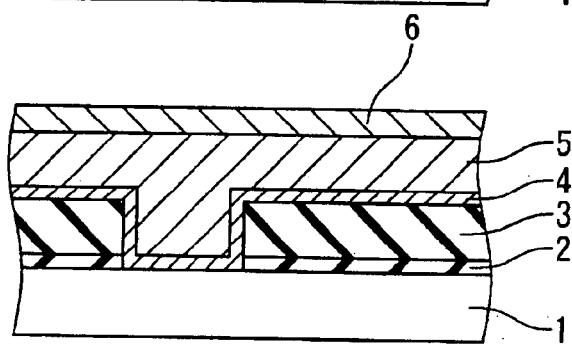
Figure 15D:
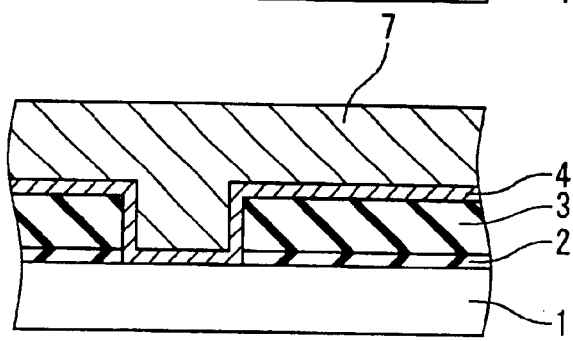
Figure 15E:
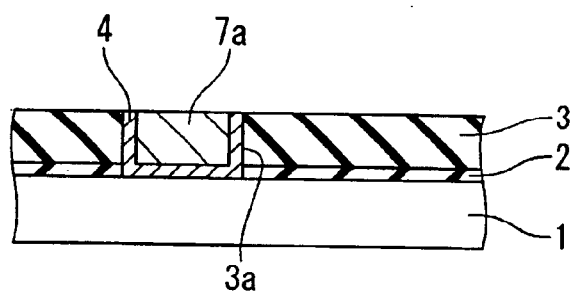

As shown in FIG. 15E, the second etch stopping film 8, the second inter-level dielectric 9, the third etch stopping film 12 and the third inter-level dielectric 13 are formed on the first inter-level dielectric 3 and the first Cu—Al interconnection 7a by this order by using the CVD method. The third etch stopping film 12 is used for stopping the dry etching for the second trench 13a. Next, the resist pattern (not shown) is formed on the third inter-level dielectric 13 for forming the via hole 9a. Next, the via hole 9a is formed by (dry) etching the third inter-level dielectric 13, the third etch stopping film 12 and the second inter-level dielectric 9. The via hole 9a penetrates the third inter-level dielectric 13, the third etch stopping film 12 and the second inter-level dielectric 9. This situation is shown in FIG. 16A.

Incidentally, the materials of the second etch stopping film 8, the second inter-level dielectric 9, the third etch stopping film 12 and the third inter-level dielectric 13 are not limited to the specific materials. They may be selected from the sets of the materials which have enough selection ratio for dry etching. These materials are selected from SiO2, SiN, SiON, SiC and the low dielectric film and so on.

Figure 16A:
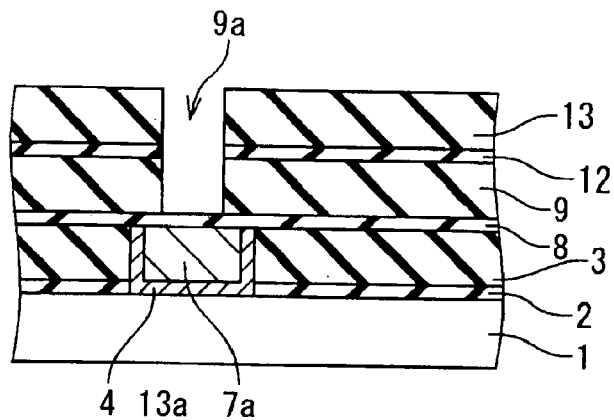
FIGS. 16A to 16D shows sectional views showing the part of the second example of the embodiment.
Figure 16B:
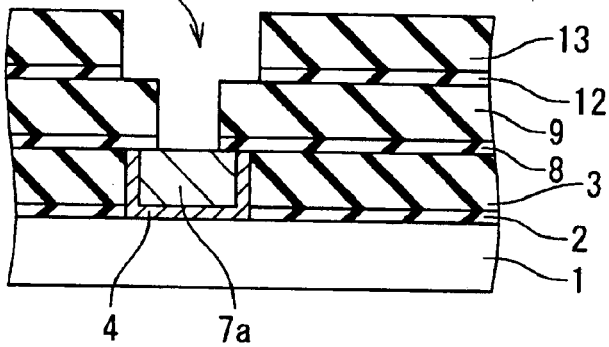

As for the situation of FIG. 16A, the resist pattern (not shown) is formed on the third inter-level dielectric 13 for forming the second trench 13a. Next, the second trench 13a is formed by (dry) etching the third inter-level dielectric 13 to the third etch stopping film 12 which is for etching stopper. After that, exposed third etch stopping film 12 and exposed second etch stopping film 8 are eliminated. This situation is shown in FIG. 16B.

Figure 16C:
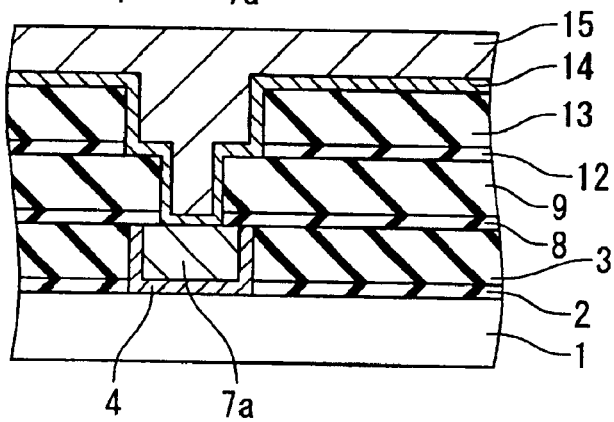

Next, the third barrier metal film 14 is formed on the third inter-level dielectric 13, in the second trench 13a and in the via hole 9a by the sputtering method. The third barrier metal film 14 is composed of the single layer film of Ti, TiN, Ta, TaN, WN and the like or the double or more layer film combined them. The third barrier metal film 14 is exemplified by the Ta/TaN of about 20 nm/20 nm in the film thickness. After that, the seed metal (not shown) of 100 nm is formed on the third barrier metal film 14 by the sputtering method. Next, the Cu 15 of 600 nm is formed by the electrolysis plating method such that Cu is buried in the second trench 13a and the via hole 9a. This situation is shown in FIG. 16C.

Figure 1C:
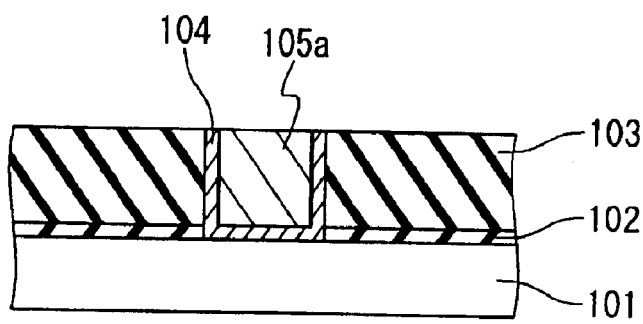
Figure 2A:
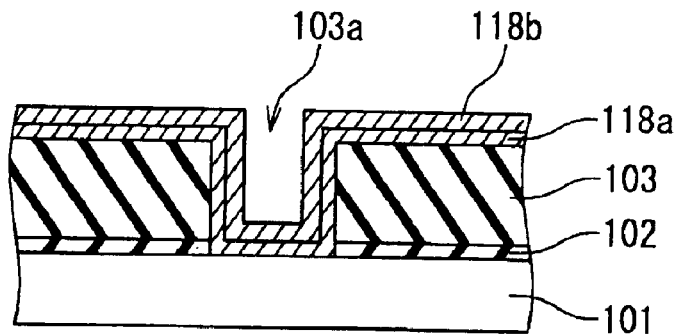
FIGS. 2A to 2C are sectional views showing the part of another conventional damascene process.
Figure 2B:
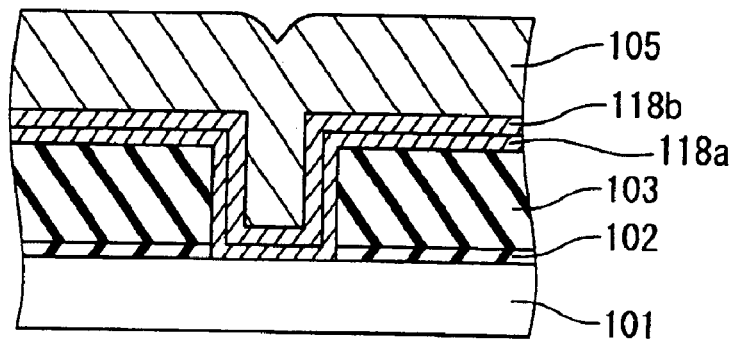
Figure 2C:
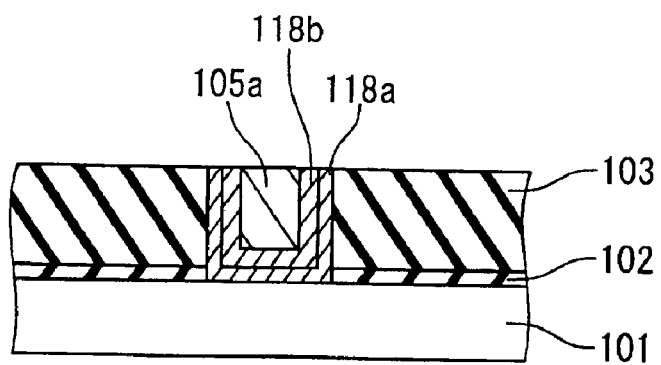
Figure 3A:
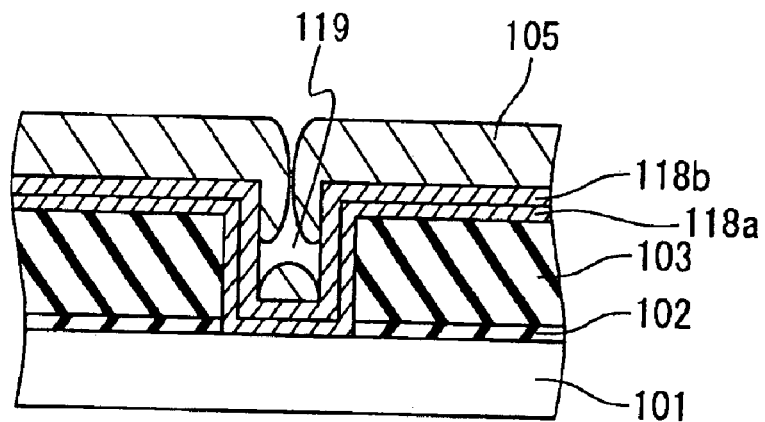
FIGS. 3A to 3b are a sectional view showing the void defect occurred during the conventional damascene process.
Figure 3B:
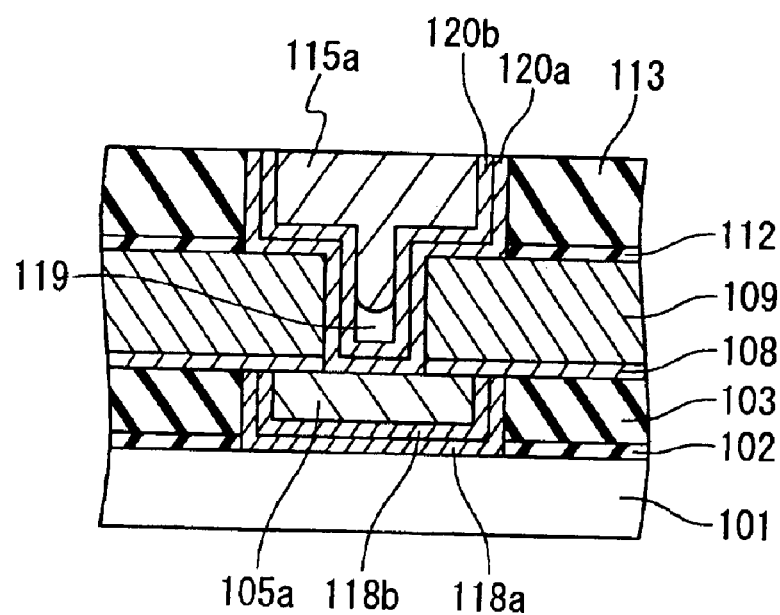
Figure 16D:
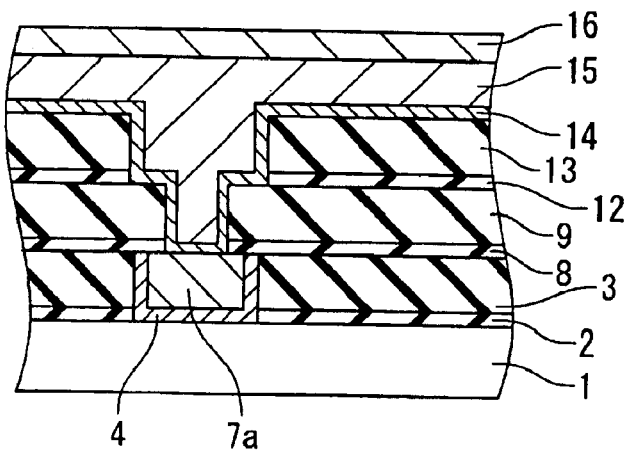
Figure 17A:
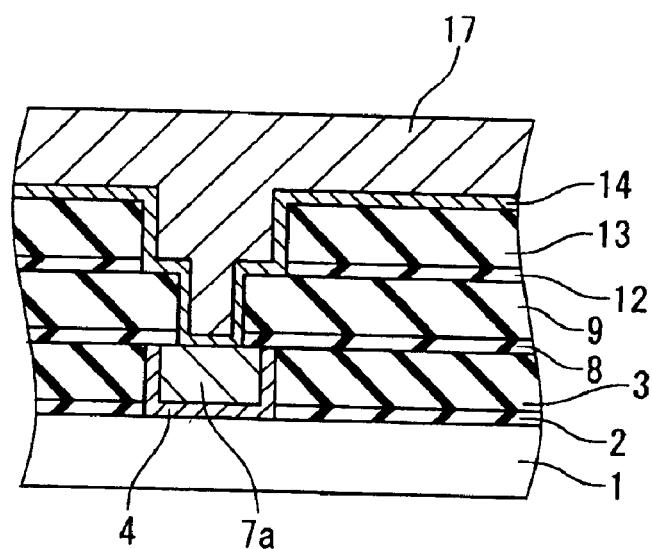
FIGS. 17A to 17B shows sectional views showing the part of the second example of the embodiment.

Next, the processes for making alloy may be carried out as explained in FIG. 1C. The Al 16 or the material including Al of 60 nm is formed on the Cu 15. This situation is shown in FIG. 16D. After that, the heat-treatment is carried out for forming alloy. The heat-treatment temperature is preferably from 200° C. to 270° C., and more preferably 250° C. to 270° C. As a result, the Cu 15 is alloyed with the Al 16 completely so as to be the solid solution as the Cu—Al alloy 17. This situation is shown in FIG. 17A.

Figure 17B:
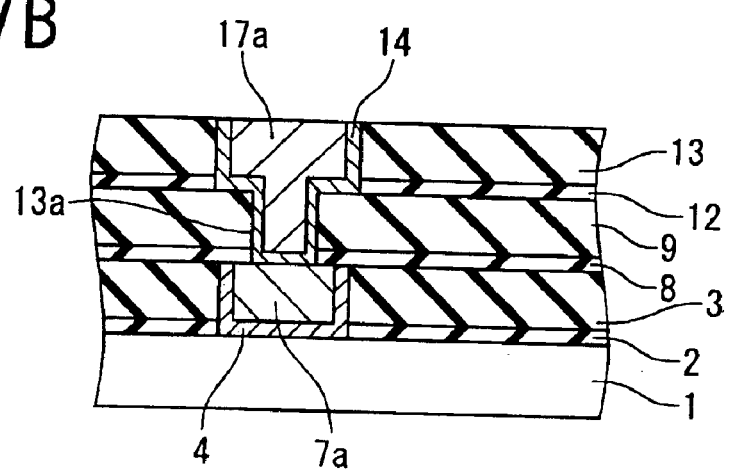

Next, the Cu—Al alloy 17 and the third barrier metal film 14 on the third inter-level dielectric 13 are removed by the CMP method. As a result, the second Cu—Al interconnection 17a and the via connected to the first Cu—Al interconnection 7a are formed in the second trench 13a and the via hole 9a, respectively. This situation is shown in FIG. 17B.

After that, by repeating similar processes, a semiconductor apparatus with the desirable multi-level interconnection structure is formed.

In this way, according to the manufacturing method of the semiconductor apparatus of the present invention, the Cu—Al alloy is formed by the heat-treatment after forming the Al or includes Al on Cu buried in the trench or the via hole. Therefore, the occurrence of the void defects and the decrease of the reliability in the conventional technique can be restrained by restraining a material movement between one interconnection to another, and between the interconnection and the via. Particularly, the structure of the second example, the interconnection and the via are formed at the same time. So, the transportation (movement) of Cu atoms is easy to occur by the post heat-treatment. In this situation, the void defects are easily generated. However, because both of the via and the interconnection are made alloy, the material movement (transportation) can be surely restrained. Also, in the method of forming Al film before Cu is buried which was shown in FIGS. 2A to 3B, it is difficult for the via and the interconnection to be buried at the same time. However, in the method of the present invention, the degradation of the property of Cu being buried can be prevented and the generation of the void defects can be also prevented.

Incidentally, the second case is explained based on the via first dual damascene process which is one of the dual damascene process. However, it is possible to apply in the same method about the dual hard mask process and other dual damascene process.

It is possible for the present invention to prevent from the defect that causes the Cu atoms movement by the heat-treatment after interconnection forming. As a result, the reliability of the interconnections can be improved.

The reason is as follows.

By heat-treatment of Al or the metallic material containing Al formed after the plating growth of Cu or the CMP of Cu, the alloy of Cu and Al can be formed at low temperature. Therefore, the movement of Cu accompanying the balancing of entropy can be restrained even if the heat-treatment is carried out after forming the interconnection. So, the occurrence of the void defects can be prevented.

Also, it is possible for the present invention to prevent from the degradation of the property of Cu being buried.

The reason is as follows.

Al or the material containing Al for forming alloy is formed on Cu which is buried in the trench or the via hole, rather than in the trench or the via. Therefore, it never increases the aspect ratio of the trench or the via hole. Also, it is not necessary to use the equipment which has a good property of Cu being buried by forming Al or the material containing Al on Cu. Then, this invention can be applied to the fine interconnection and the via of equal to or less than 0.2 μm.

What is claimed is:

1. A semiconductor apparatus comprising:
   an under layer formed above a substrate;
   a first insulating layer formed on said under layer; and
   a first conductive portion formed in a first concave portion which passes through said first insulating layer to said under layer;
   wherein said first conductive portion includes:
      a first barrier metal layer formed on a side wall and a bottom surface of said first concave portion; and
      a first metal portion formed on said first barrier metal layer such that the rest of said first concave portion is filled with said first metal portion; and said first metal portion includes a first alloy comprising copper and aluminum;

wherein a containing percentage of aluminum in said first alloy is 0.1 to 10 atm %.

2. The semiconductor apparatus according to claim 1, further comprising:

a second insulating layer formed on said first insulating layer and said first conductive portion; and a second conductive portion formed in a second concave portion which passes through said second insulating layer to said first conductive portion;

wherein said second conductive portion includes:

a second barrier metal layer formed on a side wall and a bottom surface of said second concave portion; and a second metal portion formed on said second barrier metal layer such that the rest of said second concave portion is filled with said second metal portion;

said second metal portion includes a second alloy comprising copper and aluminum;

said first conductive portion is one of an interconnection and a via, said second conductive portion is one of an interconnection and a via, and a containing percentage of aluminum in said second alloy is 0.1 to 10 atm %.

3. The semiconductor apparatus according to claim 2 wherein a ratio of an area of larger one of said first conductive portion and said second conductive portion to an area of the other is equal to or greater than 20.

4. The semiconductor apparatus according to claim 1 wherein a resistance of said first conductive portion is lower than that of said first conductive portion when said first metal portion consists of aluminum.

5. The semiconductor apparatus according to claim 4 wherein an aspect ratio of said first concave portion is equal to or greater than 2.

6. The semiconductor apparatus according to claim 5 wherein a width of said first conductive portion is equal to or less than 0.18 µm, a depth of said first conductive portion is equal to or greater than 0.3 µm, a thickness of said first barrier metal layer is equal to or greater than 0.01 µm, such that said first metal portion is formed in said first concave portion.

7. The semiconductor apparatus according to claim 1, wherein a containing percentage of aluminum in said first alloy is 5 to 10 atm %.

8. The semiconductor apparatus according to claim 1, wherein said barrier metal layer comprises at least one of Ti, TiN, Ta, TaN and WN.

* * * * *